(12) United States Patent
Xu et al.

(10) Patent No.: US 11,729,971 B2
(45) Date of Patent: Aug. 15, 2023

(54) TRENCH STRUCTURES FOR THREE-DIMENSIONAL MEMORY DEVICES

(71) Applicant: Yangtze Memory Technologies Co., Ltd., Hubei (CN)

(72) Inventors: Qiang Xu, Hubei (CN); Zhiliang Xia, Hubei (CN); Ping Yan, Hubei (CN); Guangji Li, Hubei (CN); Zongliang Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/645,102

(22) Filed: Dec. 20, 2021

(65) Prior Publication Data

US 2022/0115395 A1    Apr. 14, 2022

Related U.S. Application Data

(60) Continuation of application No. 16/918,683, filed on Jul. 1, 2020, now Pat. No. 11,205,656, which is a
(Continued)

(30) Foreign Application Priority Data

Mar. 7, 2017    (CN) .......................... 201710131738.5

(51) Int. Cl.
*H10B 43/20*    (2023.01)
*H01L 21/762*    (2006.01)
(Continued)

(52) U.S. Cl.
CPC ........... *H10B 43/20* (2023.02); *H01L 21/762* (2013.01); *H10B 43/10* (2023.02); *H10B 43/27* (2023.02); *H10B 43/35* (2023.02); *H10B 43/50* (2023.02)

(58) Field of Classification Search
CPC ......... H01L 27/11578; H01L 27/11575; H01L 27/11565; H01L 27/1157; H01L 27/0688
See application file for complete search history.

(56) References Cited

U.S. PATENT DOCUMENTS 8,089,120 B2    1/2012    Tanaka et al.
8,294,199 B2    10/2012    Yahashi et al.
(Continued)

FOREIGN PATENT DOCUMENTS

CN    103579125 A    2/2014
CN    103824859 A    5/2014
(Continued)

OTHER PUBLICATIONS

International Search Report and Written Opinion of the International Searching Authority directed to related International Patent Application No. PCT/CN2018/077706, dated Jun. 7, 2018; 8 pages.
(Continued)

*Primary Examiner* — Julia Slutsker
(74) *Attorney, Agent, or Firm* — Sterne, Kessler, Goldstein & Fox P.L.L.C.

(57) ABSTRACT

The present disclosure describes method and structure of a three-dimensional memory device. The memory device includes a substrate and a plurality of wordlines extending along a first direction over the substrate. The first direction is along the x direction. The plurality of wordlines form a staircase structure in a first region. A plurality of channels are formed in a second region and through the plurality of wordlines. The second region abuts the first region at a region boundary. The memory device also includes an insulating slit formed in the first and second regions and along the first direction. A first width of the insulating slit in the first region measured in a second direction is greater than
(Continued)

a second width of the insulating slit in the second region measured in the second direction.

20 Claims, 10 Drawing Sheets

Related U.S. Application Data division of application No. 16/046,818, filed on Jul. 26, 2018, now Pat. No. 10,727,245, which is a continuation of application No. PCT/CN2018/077706, filed on Mar. 1, 2018.

(51) Int. Cl.
*H10B 43/10* (2023.01)
*H10B 43/27* (2023.01)
*H10B 43/35* (2023.01)
*H10B 43/50* (2023.01)

(56) References Cited

U.S. PATENT DOCUMENTS

| | | | |
|---|---|---|---|
| 8,426,908 | B2 | 4/2013 | Higashi |
| 8,592,939 | B2 | 11/2013 | Nakazawa |
| 8,877,587 | B2 | 11/2014 | Noh |
| 8,969,945 | B2 | 3/2015 | Kito et al. |
| 9,190,514 | B2 | 11/2015 | Lee et al. |
| 10,388,605 | B2 | 8/2019 | Kim et al. |
| 2002/0110039 | A1 | 8/2002 | Forbes et al. |
| 2005/0079693 | A1 | 4/2005 | Kang et al. |
| 2010/0270608 | A1 | 10/2010 | Pham et al. |
| 2011/0057251 | A1 | 3/2011 | Higashi |
| 2012/0170368 | A1 | 7/2012 | Lee et al. |
| 2013/0009229 | A1 | 1/2013 | Lee et al. |
| 2013/0009236 | A1 | 1/2013 | Lee et al. |
| 2013/0043509 | A1 | 2/2013 | Cho et al. |
| 2014/0035024 | A1 | 2/2014 | Noh |
| 2016/0035732 | A1* | 2/2016 | Lee .............. H01L 27/115 438/268 |
| 2016/0064279 | A1 | 3/2016 | Hyun |
| 2017/0025438 | A1 | 1/2017 | Lee et al. |
| 2019/0081059 | A1 | 3/2019 | Xu et al. |

FOREIGN PATENT DOCUMENTS

| | | |
|---|---|---|
| CN | 106876391 A | 6/2017 |
| JP | 2010-114113 A | 5/2010 |
| JP | 2011/060838 A | 3/2011 |
| JP | 2012-156392 A | 8/2012 |
| JP | 2013/021319 A | 1/2013 |
| JP | 2014/045229 A | 3/2014 |
| JP | 2014-053605 A | 3/2014 |
| KR | 2008/0010600 A | 1/2008 |
| KR | 101113766 B1 | 2/2012 |
| KR | 1020180005033 A | 1/2018 |

OTHER PUBLICATIONS

Chinese Office Action directed to Chinese Patent Application No. 202011079049.2, dated Apr. 28, 2023; 18 pages.

* cited by examiner

TRENCH STRUCTURES FOR THREE-DIMENSIONAL MEMORY DEVICES

CROSS-REFERENCE TO RELATED APPLICATIONS

This application is a continuation application of U.S. patent application Ser. No. 16/918,683, titled "Trench Structures for Three-Dimensional Memory Devices," which is filed on Jul. 1, 2020 and issuing as U.S. Pat. No. 11,205,656 on Dec. 21, 2021, which is a divisional application of U.S. patent application Ser. No. 16/046,818, titled "Trench Structures for Three-Dimensional Memory Devices" and filed on Jul. 26, 2018, which claims the priority of Chinese Patent Application No. 201710131738.5 filed on Mar. 7, 2017 and PCT Patent Application No. PCT/CN2018/077706 filed on Mar. 1, 2018, all of which are incorporated herein by reference in their entireties.

BACKGROUND

Flash memory devices have undergone rapid development. Flash memory devices can store data for a considerably long time without powering, and have the advantages such as high integration level, fast access, easy erasing and rewriting. Flash memory devices have thus been widely used in different fields such as automation and control. To further improve the bit density and reduce cost, three-dimensional NAND flash memory devices have been developed.

A three-dimensional NAND flash memory device often includes a stack of gate electrodes arranged over a substrate, with a plurality of semiconductor channels through and intersecting the wordlines, into the substrate. The bottom gate electrodes function as bottom select gates. The top gate electrodes function as top select gates. The word lines/gate electrodes between the top select gate electrodes and the bottom gate electrodes function as wordlines. The intersection of a wordline and a semiconductor channel forms a memory cell. The top select gates are connected to wordlines for row selection, and the bottom select gates are connected to bitlines for column selection.

BRIEF SUMMARY

Embodiments of 3D memory architectures and fabrication methods thereof are disclosed herein.

In some embodiments, a slit structure layout includes a slit opening which includes a wordline staircase slit opening and an array slit opening. The slit structure layout also includes channel openings located between adjacent slit openings. The wordline staircase slit opening abuts the array slit opening. The length of the slit openings extend along a lateral direction and the widths of the slit openings are measured perpendicular to the lateral direction. A width of the wordline staircase slit opening is greater than a width of the array slit opening.

In some embodiments, the width of the wordline staircase slit opening is greater than the width of the array slit opening by about 10 nm to about 50 nm (inclusive). The width of the wordline staircase slit opening can be uniform.

In some embodiments, the end structure of the wordline staircase slit opening that is further away from the array slit includes a curved end structure. The curved end structure can include an arc-shaped structure with the arc facing the array slit opening.

In some embodiments, the width of the wordline staircase slit opening increases towards the end structure that is further away from the array slit opening.

In some embodiments, a slit structure layout also includes contact structures formed adjacent to the wordline staircase slit opening, and respective portions of a contact structure and the end structure of the wordline staircase slit opening that are furthest away from the array slit opening are separated by about 0.5 μm to about 2 μm, inclusive.

In some embodiments, a semiconductor device can include any one of the slit structure layout design described above, and the semiconductor device can include a substrate, a slit structure formed in the substrate. The slit structure includes wordline staircase slits and array slits. Channels can be located between adjacent slits. The wordline staircase slits abut the array slits. Width of the wordline staircase slit opening is greater than a width of the array slit opening, and the widths are measured along a direction that is perpendicular to the direction in which the slits extend along. In some embodiments, the semiconductor device is a three-dimensional memory device.

In some embodiments, the present disclosure provides a method for making a semiconductor device, the method includes providing a substrate having a wordline staircase region and an array region. Forming a mask pattern on the substrate, the mask pattern corresponds to the slit structure layout described above. Etching the substrate according to the mask pattern and form wordline staircase slit and array slit.

According to the above disclosure, the present disclosure describes a slit structure layout, semiconductor structures, and methods of making semiconductor structures. The width of a wordline staircase slit is greater than the width of an array slit. The widths of the slit openings are measured along a direction that is perpendicular to the direction of the slit length. Due to the increased width of the wordline staircase slit opening, a bottom width of the wordline staircase slit opening is also increased. Metal material disposed in the wordline staircase slits with increased widths can result in more uniform metal dispose and avoid metal material agglomeration, which in turn provides at least the benefits of effectively separating wordline structures from different tiers and avoid shorts or leakage current between wordline structures.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
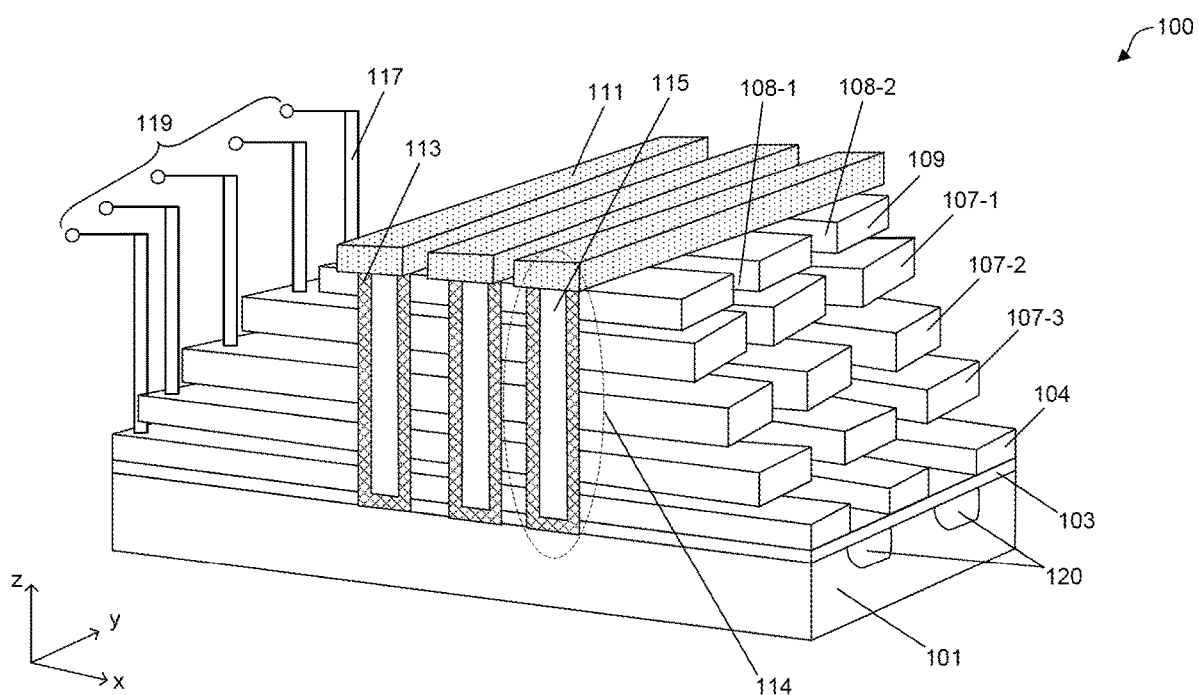
FIG. 1 illustrates an exemplary three-dimensional memory device.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

Trends in three-dimensional NAND memory industry include the reduction of device dimensions and the simplification of fabrication process. In a three-dimensional NAND memory device, memory cells for storing data are embedded in a stack of wordlines (control gate electrodes) and the semiconductor channels formed through the stack. Each wordline is separately connected to a metal contact via, which is further connected to a metal interconnect and an external circuit (e.g., control circuit). This permits writing and erasing data in the memory cells to be controlled from an external circuit. Thus, the number of metal contact vias is often equal to the number of wordlines. As the demand of storage capacity increases, numerous memory cells, which are formed by an increased number of wordlines and semiconductor channels, can be formed in a NAND memory device.

Adjacent stacks of wordlines or control gate electrodes are separated by gate line slits, which are deep trenches formed vertically through the stacks and filled with insulating material. The gate line slits can extend through an array region as well as a wordline staircase region. Accordingly, as the need for more wordlines increases, the stack height of the wordline layers can be increased, which leads to gate line slits with higher aspect ratios (trench height divided by trench width). Trenches with a high aspect ratio can be challenging for device fabrication processes due to the difficulty of uniform dispose and/or etching within the trenches. For example, an array region and a wordline staircase region are typically formed of different materials. As gate line slit extends through both regions, the etching profile can vary due to different etching performance on different materials. The variation in etching profile can be exacerbated by increased trench aspect ratio, which can cause additional metal remaining at the bottom of the trench after gate electrodes are separated by etching back the disposed metal. And current leakage or shorts between adjacent gate electrodes caused by the remaining metal can lead to device failure.

The present disclosure describes a three-dimensional NAND memory device in which the width of gate line slit is increased in the wordline staircase regions in comparison to its width in the array region. The disclosed method and structure can be incorporated into three-dimensional NAND memory device design and manufacture without adding any additional fabrication steps or additional masks. Increasing the gate line slit width at the top surface of the wordline staircase region can lead to an increased width at the bottom of the gate line slit. A benefit, among others, of increasing the gate line slit width in the wordline staircase region facilitates uniform metal dispose and avoids metal agglomeration at the bottom of the gate line slit. Uniform metal dispose within the gate line slit in turn provides uniform gate electrode material etch back and prevents current leakage or shorts between adjacent gate electrodes.

In the present disclosure, for ease of description, "tier" is used to refer to elements of substantially the same height along the vertical direction. For example, a wordline and the underlying gate dielectric layer can be referred to as "a tier," a sacrificial layer and the underlying insulating layer can together be referred to as "a tier," a wordline and the underlying insulating layer can together be referred to as "a tier," wordlines of substantially the same height can be referred to as "a tier of wordlines" or similar, and so on.

FIG. 1 illustrates a block 100 of a three-dimensional NAND flash memory device. The flash memory device includes a substrate 101, an insulating layer 103 over substrate 101, a tier of bottom select gate electrodes 104 over insulating layer 103, and a plurality of tiers of control gate electrodes 107 (e.g., 107-1, 107-2, and 107-3) stacking on top of bottom select gate electrodes 104. Flash memory device 100 also includes a tier of top select gate electrodes 109 over the stack of control gate electrodes 107, doped source line regions 120 in portions of substrate 101 between adjacent bottom select gate electrodes 104, and semiconductor channels 114 through top select gate electrodes 109, control gate electrodes 107, bottom select gate electrodes 104, and insulating layer 103. Semiconductor channel 114 (illustrated by a dashed eclipse) includes a memory film 113 over the inner surface of semiconductor channel 114 and a core filling film 115 surrounded by memory film 113 in semiconductor channel 114. The flash memory device 100 further includes a plurality of bitlines 111 disposed on and connected to semiconductor channels 114 over top select gate electrodes 109. A plurality of metal interconnects 119 are connected to the gate electrodes (e.g., 104, 107, and 109) through a plurality of metal contacts 117. Insulating layers between adjacent tiers of gate electrodes are not shown in FIG. 1, but would be apparent to a person of ordinary skill in the memory art. The gate electrodes are also referred to as the wordlines, which include top select gate electrodes 109, control gate electrodes 107, and bottom select gate electrodes 104.

In FIG. 1, for illustrative purposes, three tiers of control gate electrodes 107-1, 107-2, and 107-3 are shown together with one tier of top select gate electrodes 109 and one tier of bottom select gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact via 117. That is, the number of metal contacts formed on the gate electrodes equals the number of gate electrodes (i.e., the sum of all top select gate electrodes 109, control gate electrodes 107, and bottom select gate electrodes 104). Further, the same number of metal interconnects is formed to connect to each metal contact via 117.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. The structures 200-800 illustrated in FIG. 2A to FIG. 8 are each portions of a three-dimensional NAND memory device. Other parts of the memory device are not shown for ease of description. Although using a three-dimensional NAND device as an example, in various applications and designs, the disclosed structure can also be applied in similar or different semiconductor devices to, e.g., reduce the leakage current between adjacent wordlines. The specific application of the disclosed structure should not be limited by the embodiments of the present disclosure. For illustrative purposes, wordlines and gate electrodes are used interchangeably to describe the present disclosure. In various embodiments, the number of layers, the methods to form these layers, and the specific order to form these layers may vary according to different designs and should not be limited by the embodiments of the present disclosure. It should be noted that the "x" and "y" directions illustrated in these figures are for clarity purposes and should not be limiting. Exemplary structures shown in FIGS. 2A-8 can be portions of three-dimensional memory devices, and the three-dimensional memory device can include wordline staircase regions extending in any suitable direction such as, for example, positive y direction, negative y direction, positive x direction, negative x direction, and/or any suitable directions.

Figure 2A:
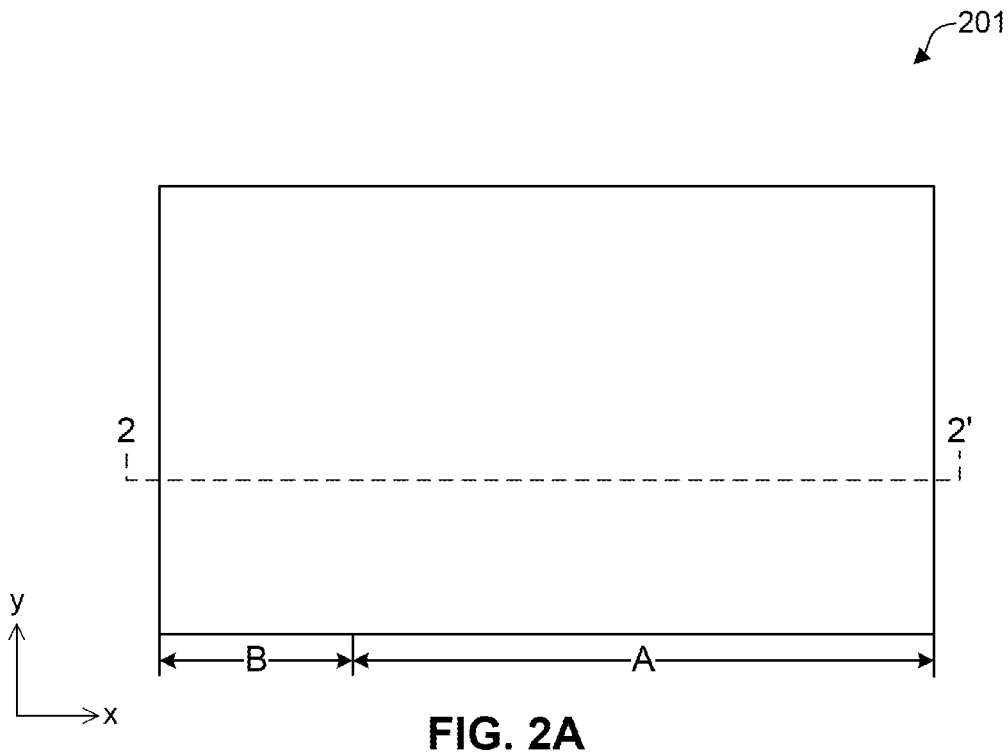
FIGS. 2A and 2B illustrate respectively a top and a cross-section of a three-dimensional memory structure, according to some embodiments.
Figure 2B:
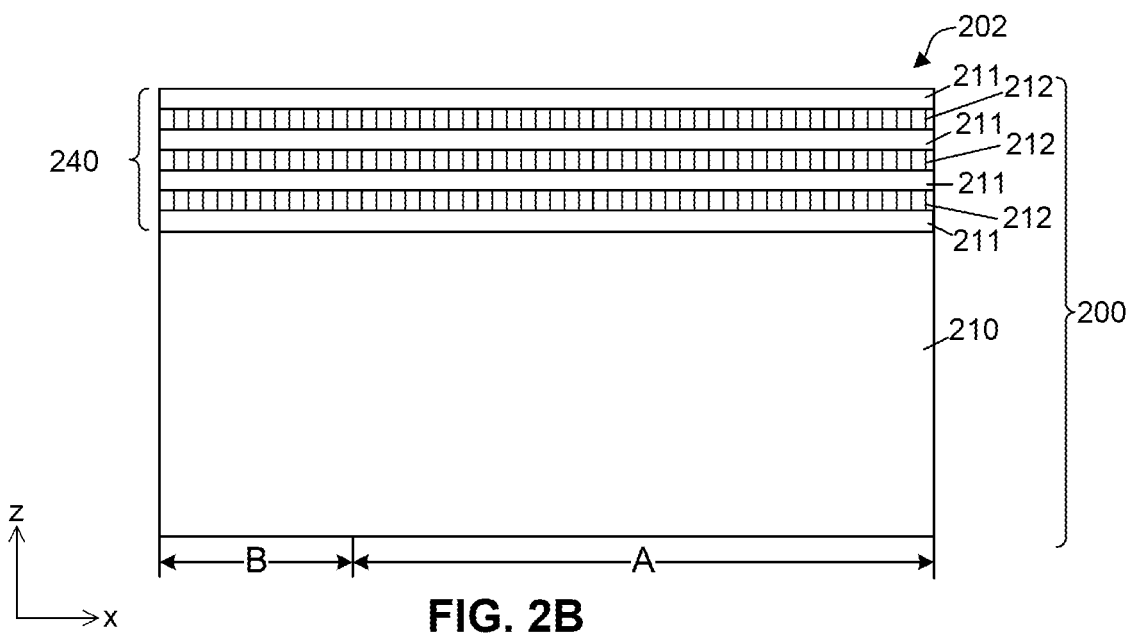

FIGS. 2A and 2B illustrate an exemplary substrate 200 for forming a three-dimensional memory structure, according to some embodiments. FIG. 2A is a top view 201 of structure 200, and FIG. 2B is a cross-sectional view 202 of structure 200 along 2-2' direction. In some embodiments, substrate 200 includes a base substrate 210 and a material layer 240 over substrate 210. Base substrate 210 can provide a platform for forming subsequent structures. Material layer 240 can include an alternating stack (e.g., dielectric layer pairs/stack) having a first material/element 211 and a second material/element 212 arranged alternatingly. Material layer 240 can be used to form subsequent wordlines over base substrate 210. For illustrative purposes, four tiers/pairs of first material 211/second material 212 are shown to describe the present disclosure. In various applications and designs, material layer 240 can include any suitable number of tiers/pairs of first material/second material stacking together, depending on the design of the three-dimensional memory device. For example, material layer 240 can include 64 tiers/pairs of first material/second material stacking together, which subsequently forms 64 tiers of wordline in the three-dimensional memory device.

In some embodiments, base substrate 210 includes any suitable material for forming the three-dimensional memory structure. For example, base substrate 210 can include silicon, silicon germanium, silicon carbide, silicon on insulator (SOI), germanium on insulator (GOI), glass, gallium nitride, gallium arsenide, and/or other suitable III-V compound.

In some embodiments, material layer 240 includes an alternating stack of insulating layers 211 (i.e., first element or first material) and sacrificial layers 212 (i.e., second element or second material), arranged vertically (along z-axis) over base substrate 210. For illustrative purposes, the insulating layer 211 and the corresponding underlying sacrificial layer 212 are referred to as an element pair or material pair of the same tier. In some embodiments, sacrificial layers 212 are removed subsequently for disposing gate metal material for forming wordlines. In some embodiments, sacrificial layers 212 include any suitable material different from insulating layers 211. For example, sacrificial layers 212 can include poly-crystalline silicon, silicon nitride, poly-crystalline germanium, and/or poly-crystalline germanium-silicon. In some embodiments, sacrificial layers 212 include silicon nitride. Insulating layers 211 can include any suitable insulating materials, e.g., silicon oxide. Material layer 240 can be formed by alternatingly disposing insulating layers 211 and sacrificial layers 212 over base substrate 210. For example, an insulating layer 211 can be disposed over base substrate 210, and a sacrificial layer 212 can be disposed on insulating layer 211, and so on and so forth. The dispose of insulating layers 211 and sacrificial layers 212 can be include any suitable methods such as chemical vapor deposition (CVD), physical vapor deposition (PVD), plasma-enhanced CVD (PECVD), sputtering, metal-organic chemical vapor deposition (MOCVD), and/or atomic layer deposition (ALD). In some embodiments, insulating layers 211 and sacrificial layers 212 are each formed by CVD. For illustrative purposes, substrate 200 is divided into two regions, i.e., regions A and B. In the subsequent fabrication of the three-dimensional memory structure, wordlines (gate electrodes) are formed through regions A and B along a horizontal direction (e.g., x-axis) substantially parallel to the top surface of substrate 200. After the subsequent fabrication steps discussed below, wordline staircase structures are substantially formed in region A, and semiconductor channels are formed substantially in region B. It should be noted that, regions A and B are for ease of description only, and are not intended to indicate physical division of substrate 200 or dimensions of substrate 200.

Figure 3A:
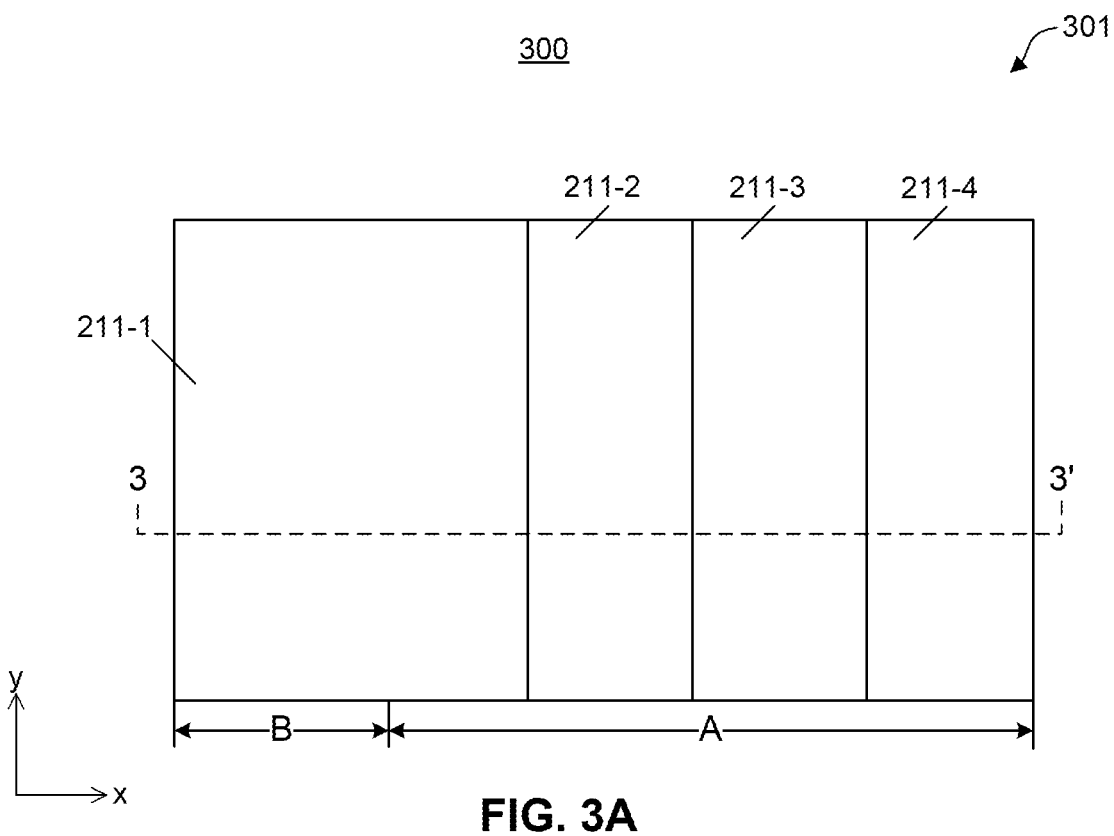
FIGS. 3A and 3B illustrate respectively a top and cross-section of a three-dimensional memory structure, according to some embodiments.
Figure 3B:
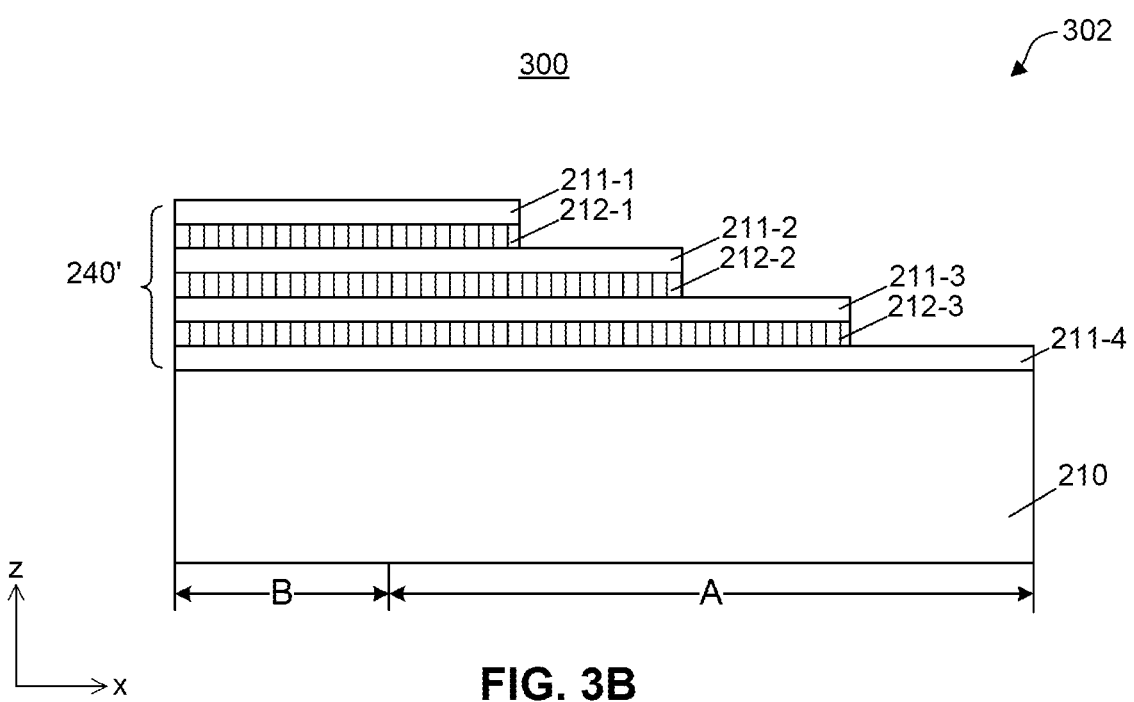

FIGS. 3A and 3B illustrate an exemplary structure 300 for forming the three-dimensional memory device, according to some embodiments. FIG. 3A is a top view 301 of structure 300, and FIG. 3B is a cross-sectional view 302 of structure 300 along 3-3' direction. The structure illustrated by FIGS. 3A and 3B can be referred to as a "staircase structure" or a "stepped cavity structure." Terms "staircase structure," "stepped cavity structure," or similar refer to a structure having stepped surfaces. In the present disclosure, "stepped surfaces" refer to a set of surfaces that include at least two horizontal surfaces (e.g., along x-y plane) and at least two (e.g., first and second) vertical surfaces (e.g., along z-axis) such that each of a first horizontal surface and a second horizontal surface is adjoined to a first vertical surface that extends upward from a first edge of the first horizontal surface, and the second horizontal surface is also adjoined to a second vertical surface that extends downward from a second edge of the second horizontal surface. A "step" or "staircase" refer to a vertical shift in the height of a set of adjoined surfaces.

The staircase structure can have various stepped surfaces, referring to FIGS. 3A and 3B, such that the horizontal cross-sectional shape of the staircase structure changes in step as a function of the vertical distance from the top surface of structure 300 (i.e., top surface of structure 300). In some embodiments, structure 300 is formed from structure 200 by repetitively etching insulating layers 211 and sacrificial layers 212 of material layer 240, e.g., along vertical direction (i.e., z-axis), using a mask. For illustrative purposes, the structure formed by etching material layer 240 is referred to as stack 240' over base substrate 210. Accordingly, as shown in FIGS. 3A and 3B, structure 300 can have a plurality of insulating layers (e.g., 211-1 to 211-4) and a plurality of sacrificial layers (e.g., 212-1 to 212-3). Except for the bottom insulating layer 211-4, each insulating layer 211 can form a pair or a tier with an adjacent and underlying sacrificial layer with substantially same length/shape along y axis. For example, insulating layer 211-1 and sacrificial layer 212-1 form a first tier, and insulating layer 211-2 and sacrificial layer 212-2 form a second tier, so on and so forth. The etching of the insulating layer and the sacrificial layer in each pair can be performed in one etching process or different etching processes. The etching processes can be plasma processes such as, for example, a reactive ion etching (ME) process using oxygen-based plasma. In some embodiments, the RIE etching process may include etchant gas such as, for example, carbon tetrafluoride ($CF_4$), sulfur hexafluoride ($SF_6$), fluoroform ($CHF_3$), and/or other suitable gases. Numerous other etching methods can also be suitable. After the formation of the stepped surfaces, the mask can be removed, e.g., by ashing, or by using a photoresist stripper. In some embodiments, multiple photoresist layers and/or multiple etching processes are employed to form the stepped surfaces. As shown in FIG. 3A, in structure 300, the insulating layer (i.e., 211-1 to 211-4) of each tier is exposed along z axis.

Figure 4A:
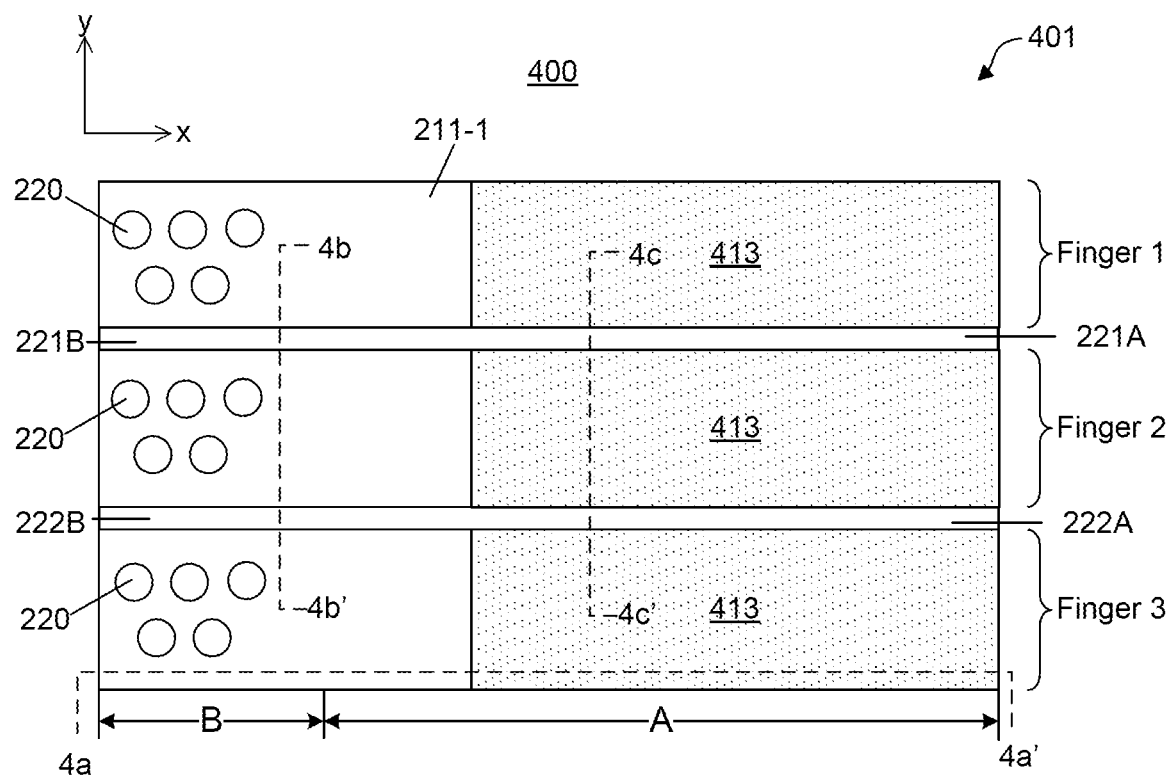
FIG. 4A illustrate a top of a three-dimensional memory structure, according to some embodiments.
Figure 4B:
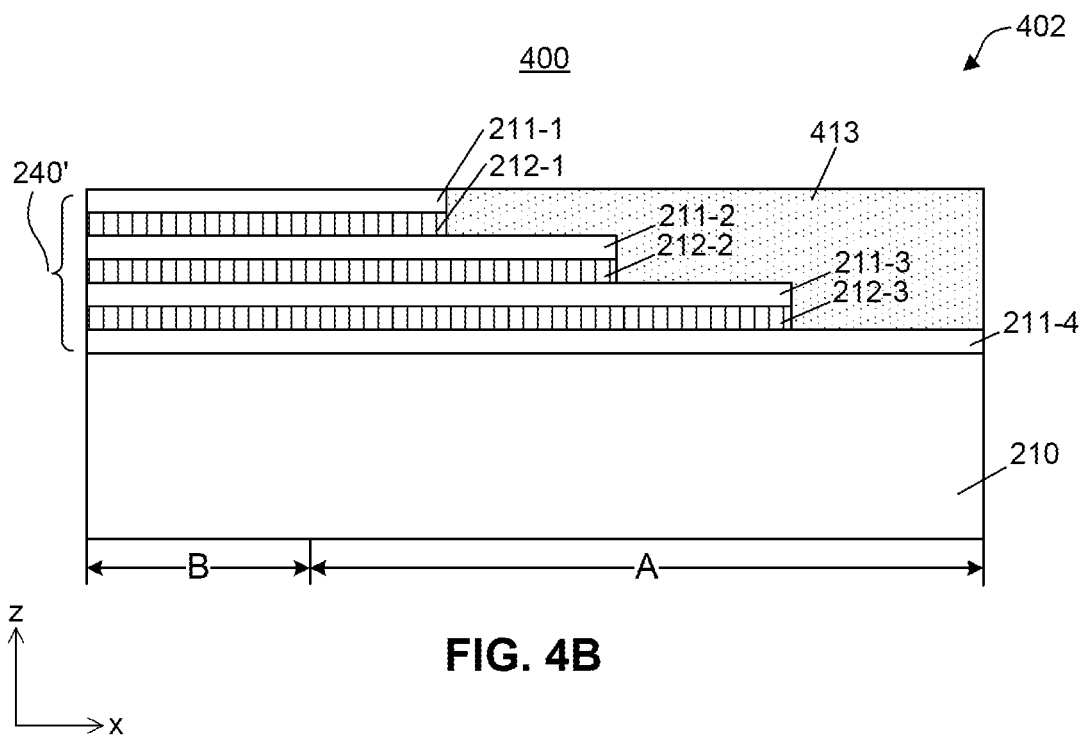
FIGS. 4B-4D illustrate cross-sections of a three-dimensional memory structure, according to some embodiments.
Figure 4C:
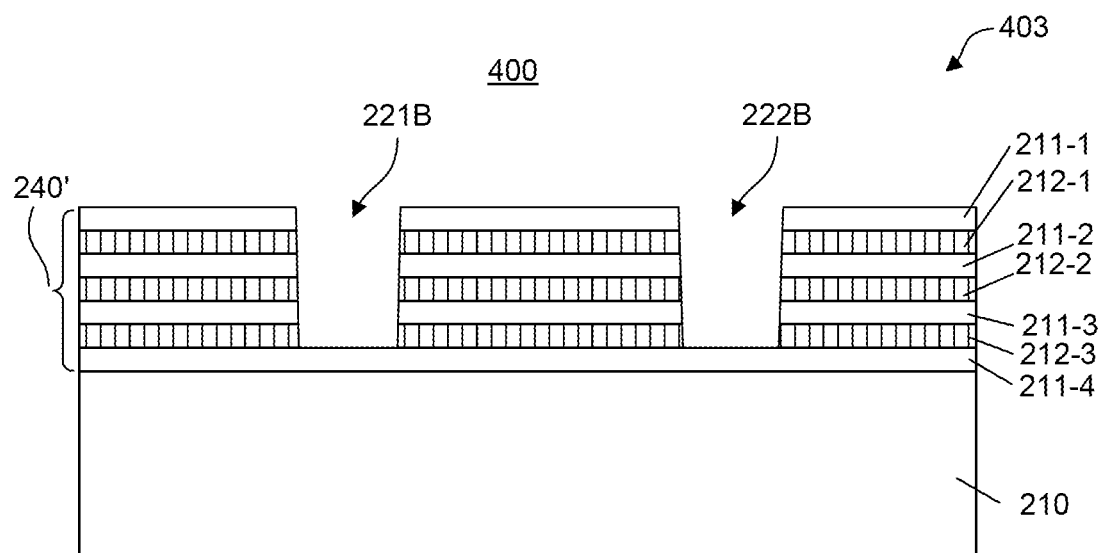
Figure 4D:
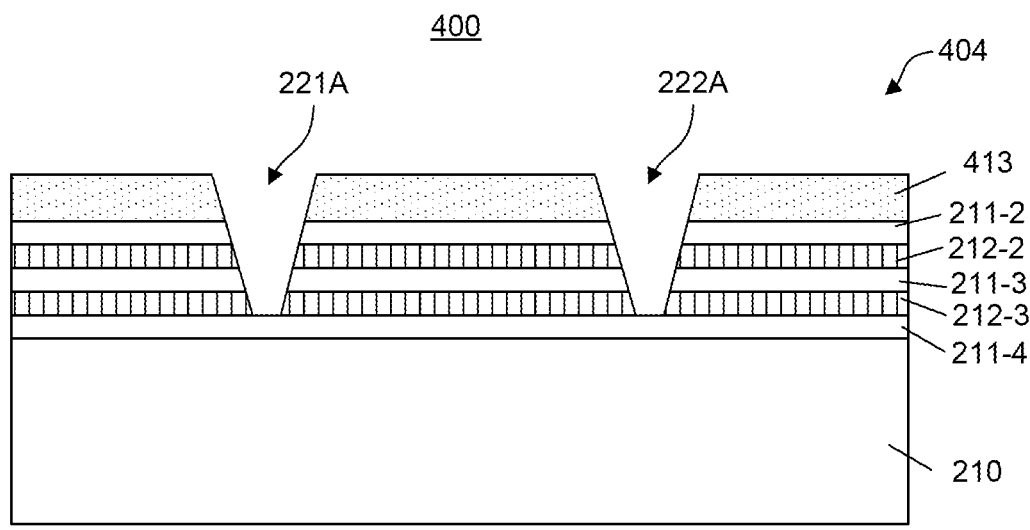

FIGS. 4A-4D illustrate an exemplary structure 400 for forming the three-dimensional memory device, according to some embodiments. FIG. 4A is a top view 401 of structure 400, and FIG. 4B is a cross-sectional view 402 of structure 400 along the 4a-4a' direction. FIG. 4C is a cross-sectional view 403 of structure 400 along the 4b-4b' direction. FIG. 4D is a cross-sectional view 404 of structure 400 along the 4c-4c' direction. In some embodiments, structure 400 includes a plurality of semiconductor channels 220 formed in region B. Semiconductor channels 220 can be distributed as arrays along y-axis, and each array is separated by a suitable distance of which can be any reasonable distance according to the design/layout of the three-dimensional memory device. Each array of semiconductor channels 220 can have the same number or different numbers of semiconductor channels 220. For illustrative purposes, referring to FIG. 4A, in the present disclosure, each array includes 5 semiconductor channels 220, forming a 3 by 2 array arrangement. Semiconductor channels 220 can be formed through stack 240 substantially along z-axis and into base substrate 210 for the subsequent formation of source and/or drain of the three-dimensional memory device. Semiconductor channels 220 and subsequently formed wordlines can form memory cells, e.g., for storing data, of the three-dimensional memory device.

Each semiconductor channel 220 can substantially have a shape of a pillar along the z-axis and can include a plurality of layers surrounding one another (not shown in the figures of the present disclosure). For example, semiconductor channel 220 can include a dielectric core positioned along z-axis and substantially in the center of semiconductor channel 220. The dielectric core can be surrounded by a semiconductor channel film. The semiconductor channel film can be surrounded by a memory film. The dielectric core, the semiconductor channel film, and the memory film can each include one or more layers, and can together fill in a channel hole to form semiconductor channel 220. In some embodiments, the channel holes can be formed by patterning stack 240' using a mask and etching the portions of stack 240 exposed by the patterned mask using a suitable etching process, e.g., dry etch and/or wet etch. The channel holes can be through stack 240 and substantially into base substrate 210. The mask can be removed after the channel holes are formed.

For example, the memory film can be formed over and contacting the sidewall of a channel hole. In some embodiments, the memory film can include one or more block dielectric layers over the sidewall of the channel hole to insulate other layers in the channel hole from stack 240' surrounding the channel hole. The memory film can also include a storage unit layer (memory layer) over and surrounded by the block dielectric layers for trapping charges and forming a plurality of charge storage regions along z-axis. The memory film can also include a tunneling layer (e.g., tunneling dielectric) over and surrounded by the memory layer. Charge tunneling can be performed through the tunneling layer under a suitable electric bias. In some embodiments, charge tunneling can be performed through hot-carrier injection or by Fowler-Nordheim tunneling induced charge transfer, depending on the operation of the three-dimensional memory device.

The one or more block dielectric layers can include a first block layer which includes a dielectric metal oxide layer with a relatively high dielectric constant. Term "metal oxide" can include a metallic element and non-metallic elements such as oxygen, nitrogen, and other suitable elements. For example, the dielectric metal oxide layer can include aluminum oxide, hafnium oxide, lanthanum oxide, yttrium oxide, tantalum oxide, silicates, nitrogen-doped compounds, alloys, etc. the first block layer can be disposed, for example, by CVD, ALD, pulsed laser deposition (PLD), liquid source misted chemical deposition, and/or other suitable dispose methods.

The one or more block dielectric layers can also include a second block layer which includes another dielectric layer over the dielectric metal oxide. The other dielectric layer can be different from the dielectric metal oxide layer. The other dielectric layer can include silicon oxide, a dielectric metal oxide having a different composition than the first block layer, silicon oxynitride, silicon nitride, and/or other suitable dielectric materials. The second block layer can be disposed, for example, by low pressure chemical vapor deposition (LPCVD), ALD, CVD, and/or other suitable dispose methods. In some embodiments, the one or more block dielectric layers include silicon oxide, which is formed by CVD.

The storage unit layer can be sequentially formed over the one or more block dielectric layers. The storage unit layer can include a charge trapping material, e.g., a dielectric charge trapping material (e.g., silicon nitride) and/or a conductive material (e.g., doped polysilicon). In some embodiments, the dielectric charge trapping material includes silicon nitride and can be formed by CVD, ALD, PVD, and/or other suitable methods.

The tunneling layer can be sequentially formed over the memory layer. The tunneling layer can include silicon oxide, silicon nitride, silicon oxynitride, dielectric metal oxides, dielectric metal oxynitride, dielectric metal silicates, alloys, and/or other suitable materials. The tunneling layer can be formed by CVD, ALD, PVD, and/or other suitable methods. In some embodiments, the tunneling layer includes silicon oxide, which is formed by CVD.

The semiconductor channel film can be sequentially formed over the tunneling layer. The semiconductor channel film can include one or more layers of any suitable semiconductor materials such as silicon, silicon germanium, germanium, III-V compound material, II-VI compound material, organic semiconductor material, and/or other suitable semiconductor materials. The semiconductor channel film can be formed by a suitable method such as metal-organic chemical vapor deposition (MOCVD), LPCVD, CVD, and/or other suitable methods. In some embodiments, the semiconductor channel film is formed by depositing a layer of amorphous silicon using CVD, followed by an annealing process such that the amorphous silicon is converted to single-crystalline silicon. In some embodiments, other amorphous material can be annealed to be crystallized to form the semiconductor channel film.

The dielectric core can be formed over the semiconductor channel film and to fill in the space at the center of the channel hole. The dielectric core can include a suitable dielectric material such as silicon oxide and/or organosilicate glass. The dielectric core can be formed by a suitable conformal method (e.g., LPCVD) and/or self-planarizing method (e.g., spin coating). In some embodiments, the dielectric core includes silicon oxide and is formed by LPCVD.

Insulating material 413 can be formed semiconductor structure 400. For example, insulating material 413 can be formed on region A and the top surface of insulating material 413 can be coplanar with the top surface of insulating layer 211-1. In some embodiments, insulating material 413 is also formed on insulating layer 211-1, and channels 220 also penetrate insulating material 413. Insulating material 413 can include any suitable insulating materials, e.g., silicon oxide. The dispose of insulating material 413 can be include any suitable methods such as CVD, PVD, PECVD, sputtering, MOCVD, and/or ALD. In some embodiments, insulating material 413 is formed by CVD. A planarization method such as, for example, chemical mechanical polishing (CMP) can be used to planarize the top surface of insulating material 413.

Structure 400 further includes a plurality of insulating trenches or vertical trenches, each formed between two arrays of semiconductor channels 220 substantially along x-axis, to divide stack 240' into a plurality of fingers, each finger extending substantially along x-axis. In the present disclosure, term "vertical" refers to "along z-axis," "substantially perpendicular to x-y plane," or similar. Wordlines can be subsequently formed in each finger. A vertical trench can include one or more openings along x-axis. In some embodiments, the vertical trenches can be used to replace sacrificial layers 211 with metal gate electrode material. For example, after gate electrode material is disposed between adjacent sacrificial layers 212 to forms wordline structures, an etch back process can be used to remove excessive metal gate electrode material from within the trench such that wordlines from different tiers can be electrically insulated. The trenches can be subsequently filled with a suitable insulating material to form gate line slits, also referred to as insulating spacers or insulating slits. That is, subsequently-formed wordlines in adjacent fingers can be insulated at the locations filled with the insulating material.

For illustrative purposes, two adjacent vertical trenches 221 and 222 are shown in FIGS. 4A-4D of the present disclosure. Vertical trench 221 includes vertical trench 221A and 221B, respectively formed in regions A and B. Similarly, vertical trench 222 includes vertical trench 222A and 222B, respectively formed in regions A and B. The two adjacent vertical trenches 221 and 222 divide structure 400 into Fingers 1, 2, and 3, each including an array of semiconductor channels 220. Vertical trenches 221A and 222A are used to divide subsequently-formed wordlines in different fingers, while 221B and 222B of the vertical trenches are formed in region B to divide arrays of semiconductor channels 220 in different fingers along x-axis. The arrays of semiconductor channels 220 can respectively form memory cells with subsequently-formed wordlines in Fingers 1, 2, and 3.

Vertical trenches (e.g., 221 and 222) can be formed by forming a mask layer over stack 240' and patterning the mask using, e.g., photolithography, to form openings corresponding to the vertical trenches in the patterned mask layer. A suitable etching process, e.g., dry etch and/or wet etch, can be performed to remove portions of stack 240' exposed by the openings until the vertical trenches expose base substrate 210. The etching processes can be plasma processes such as, for example, an RIE process using oxygen-based plasma. In some embodiments, the RIE etching process may include etchant gas such as, for example, $CF_4$, $SF_6$, $CHF_3$, and/or other suitable gases. Numerous other etching methods can also be suitable. The mask layer can be removed after the formation of vertical trenches. In some embodiments, vertical trenches are through each of the tiers in stack 240' and divide stack 240' into a plurality of fingers along x-axis. A vertical trench can include one or more openings as described above along x-axis so that sacrificial layer/insulating layer of adjacent fingers in each tier can be connected through opening(s) of the vertical trench in between.

FIGS. 4C and 4D are respective cross-sectional view from lines 4b-4b' and 4c-4c', which represents cross-sectional views of regions B and A respectively. As shown in FIG. 4C, vertical trenches 221B and 222B are formed in region B where the semiconductor channels are formed, and therefore are formed through alternating dielectric stacks of insulating layers 211-1 through 211-4 and sacrificial layers 212-1 through 212-3. The etching process described above can continue until the trench reaches substrate 210. Due to material composition differences between regions A and B, the etching processes produce different etching profiles in these regions. For example, trenches 221A and 222A in region A are substantially formed through insulating materials and one or more staircase structures, while trenches 221B and 222B are formed through the stack of alternating dielectric materials. As described above, in some embodiments, the insulating layer 211 and insulating layer 413 can include silicon oxide. In some embodiments, sacrificial layer 212 includes silicon nitride. The etching processes can be wet etching processes that can lead to a more anisotropic etching profile performance on silicon nitride material. The etchant for silicon nitride wet etching process can react with silicon nitride material and produce a layer of polymer material on the sidewall during etching that protects the sidewalls from lateral etching. In contrast, less polymer material is formed during silicon oxide wet etching process and more lateral etching can be observed, which results in a less anisotropic etching profile on silicon oxide material. As a result, trenches in region A forms etching profiles that contain a tilted sidewall, which causes trench width at the top of the trench to be greater than trench width at the bottom of the trench. In contrast, etch profiles in region B show substantially vertical sidewalls, which indicates trench width at the top substantially equals the trench width at the bottom.

Figure 5A:
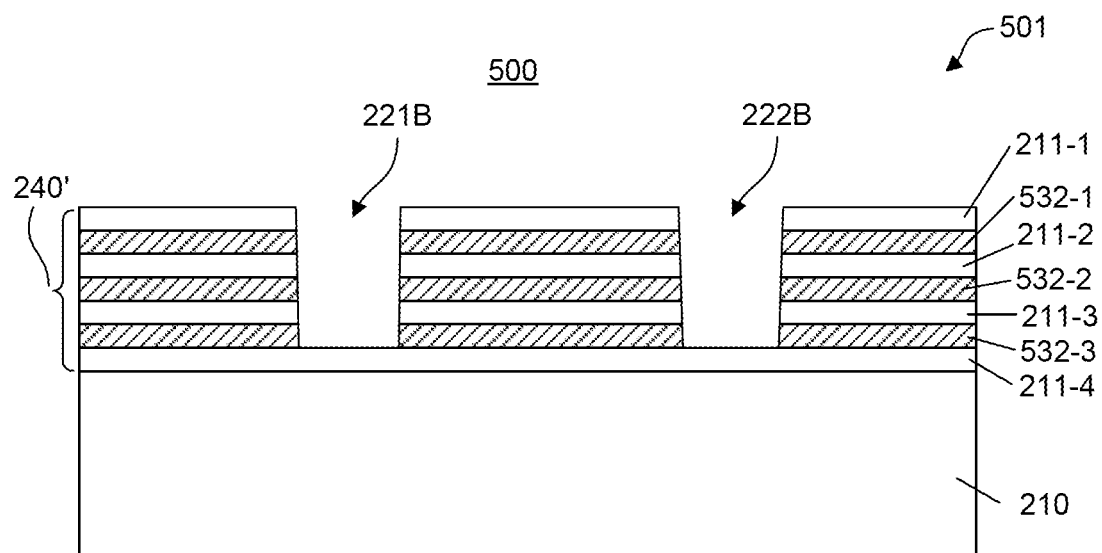
FIGS. 5A and 5B illustrate cross-sections of a three-dimensional memory structure, according to some embodiments.
Figure 5B:
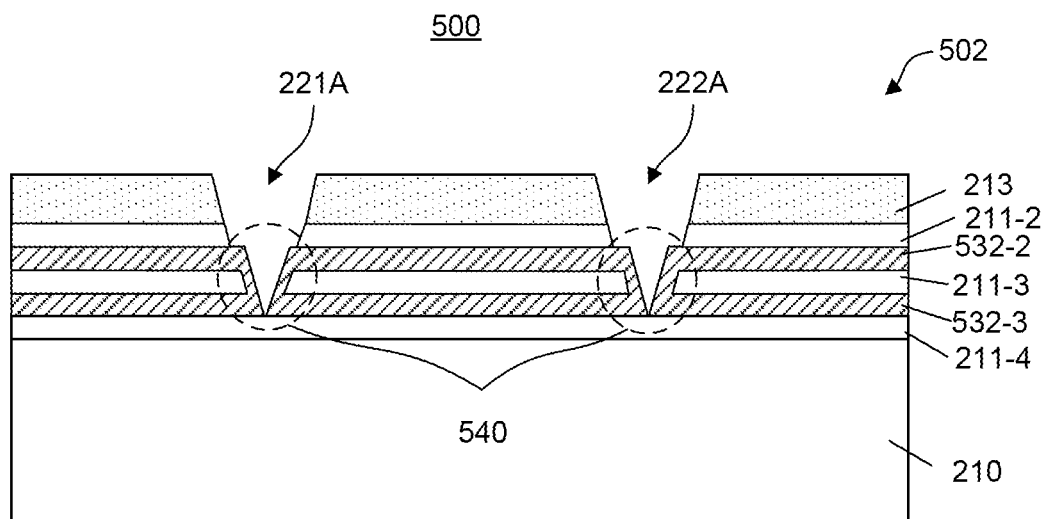

FIGS. 5A and 5B illustrate structure 500 for forming the three-dimensional memory device, according to some embodiments. FIGS. 5A and 5B illustrates the structures shown in FIGS. 4A and 4B after sacrificial material is replaced by metal gate electrode material and an etch back process has been performed to isolate each layer of gate electrode material and form wordlines 532-1 through 532-3. In some embodiments, the sacrificial layers can be removed by any suitable etching processes such as, for example, a dry etching process, a wet etching process, any other suitable etching processes, and/or combinations thereof. After the sacrificial layers are removed, horizontal trenches are formed between insulating layers and gate electrode material is disposed in the place of the sacrificial layers and in the horizontal trenches. For example, each tier of structure 500 includes a gate metal material layer over the respective insulating layer 211. In some embodiments, structure 500 can be formed from structure 400 illustrated in FIGS. 4A-4D by filling replacing sacrificial layers 212 with a suitable gate electrode metal material. The gate electrode metal material can fill each horizontal trench along x-y plane and cover the respective insulating layer 211. Gate metal material layers can provide the base material for the subsequently-formed wordlines (i.e., gate electrodes) 532-1 through 532-3 after the etch back process. In some embodiments, gate electrode material can be formed by filling vertical trenches and the horizontal trenches with a suitable conductive material. For example, a suitable dispose method, such as ALD can be used. In some embodiments, CVD, PVD, PECVD, other suitable methods, and/or combinations thereof, can be utilized to deposit the gate electrode material.

After the gate electrode material is disposed in the vertical and horizontal trenches, an etch back process can be performed to remove excessive gate electrode material from the vertical trenches such that wordlines from different tiers can be electrically insulated. Etch profiles of the vertical trenches in region B show substantially vertical sidewalls which can facilitate uniform metal dispose and in turn provides uniform etch back of gate electrode material throughout the height of the trench. For example, as shown in FIG. 5A, each layer of the formed wordline 532-1 through 532-3 formed after the etch back process is electrically insulated from one another because excessive gate electrode material is removed from the sidewalls of vertical trenches 221B and 222B. In contrast, trenches in region A forms etching profiles that contain a tilted sidewall, which causes trench width at the top of the trench to be greater than trench width at the bottom of the trench. The tapered profile causes non-uniform dispose of gate electrode material into trenches 221A and 222A. For example, gate electrode material tend to agglomerate at the bottom of trenches 221A and 222A, and the etch back process may not completely remove excessive gate electrode material from the trench sidewalls at the bottom of the trenches. The remaining gate electrode material (illustrated by dashed circles 540) on the trench sidewalls can cause shorts or current leakage between tiers of wordline structures. For example, as shown in FIG. 5B, wordline 532-2 is electrically connected to wordline 532-3 due to the excessive gate electrode material remaining on the sidewall after the etch back process.

Further structures are formed on exemplary structures to complete the three-dimensional NAND memory devices and for the ease of description the details of formation of the other structures are omitted in the present disclosure. For example, metal contact vias can be formed over each tier to connect wordlines of each tier to an external circuit. In some embodiments, the metal contact vias are formed by patterning the dielectric stack to form a number of contact openings exposing the contact areas on each tier, and filling the contact openings with a suitable conductive material to form the metal contact vias. The patterning process can include forming a mask over the dielectric stack, performing a photolithography process to define the contact openings in the mask, and removing the material in the contact openings until desired contact areas of wordline staircase region are exposed. The contact areas of each tier can be on one or more wordlines. Further, the contact openings can be filled with a suitable conductive material, e.g., tungsten, aluminum, and/or copper.

Figure 6:
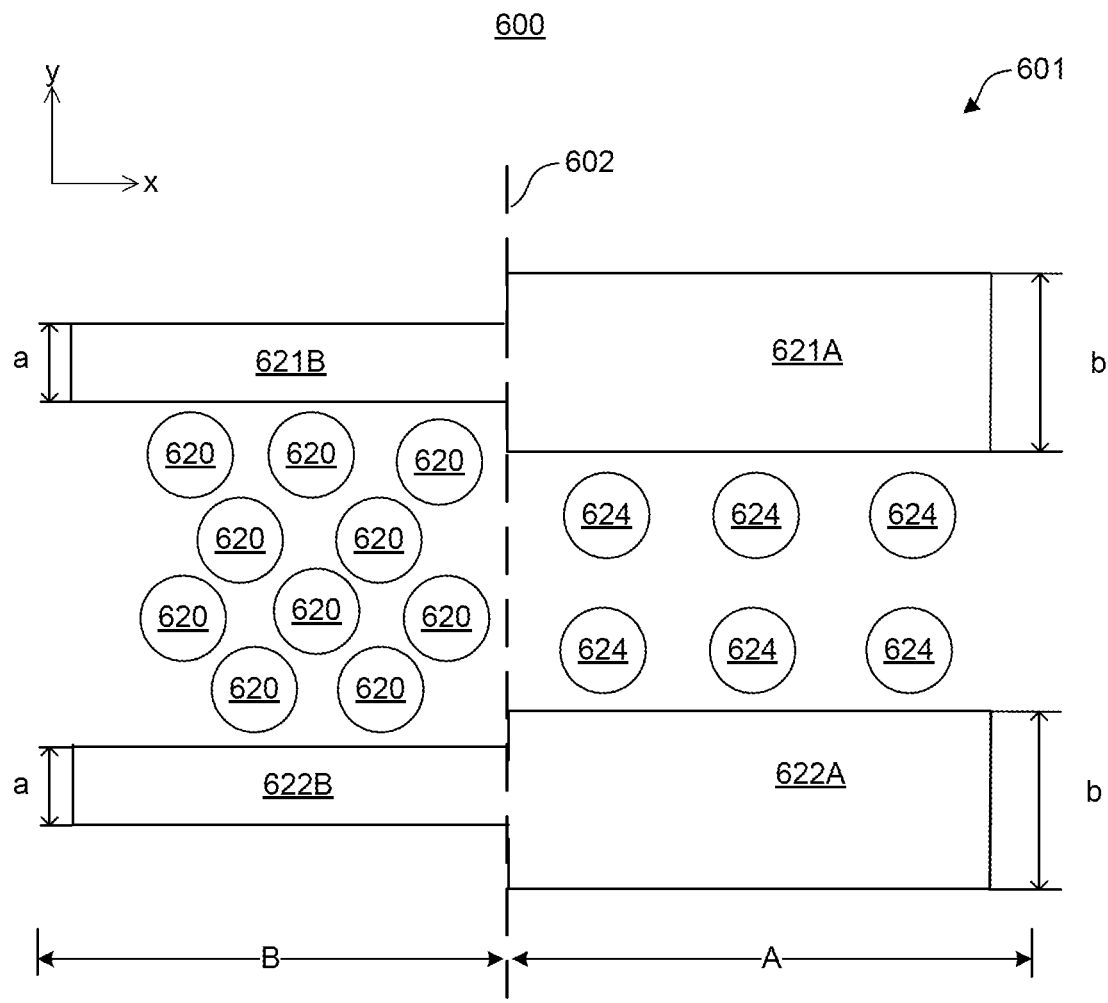
FIGS. 6-8 illustrate tops of a three-dimensional memory structure, according to some embodiments.
Figure 7:
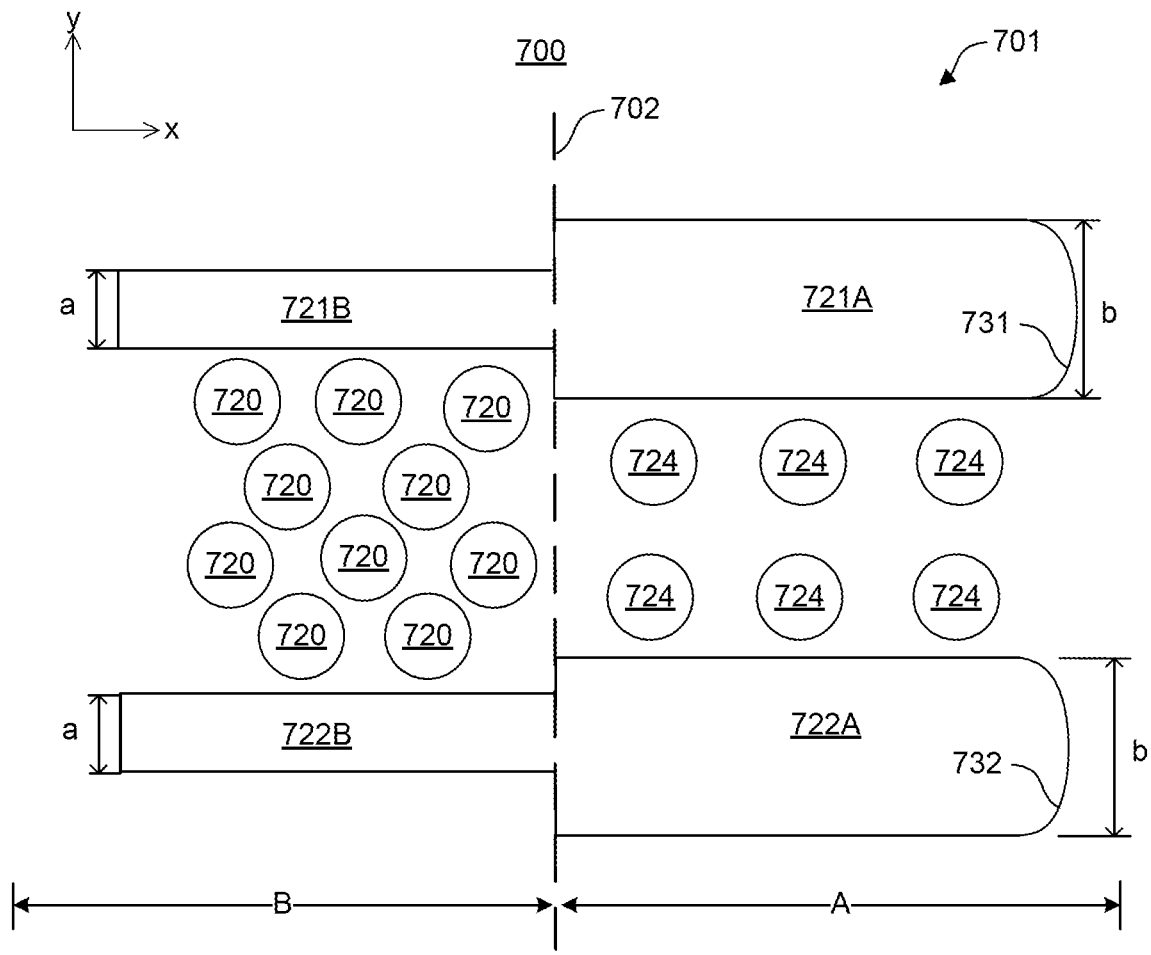
Figure 8:
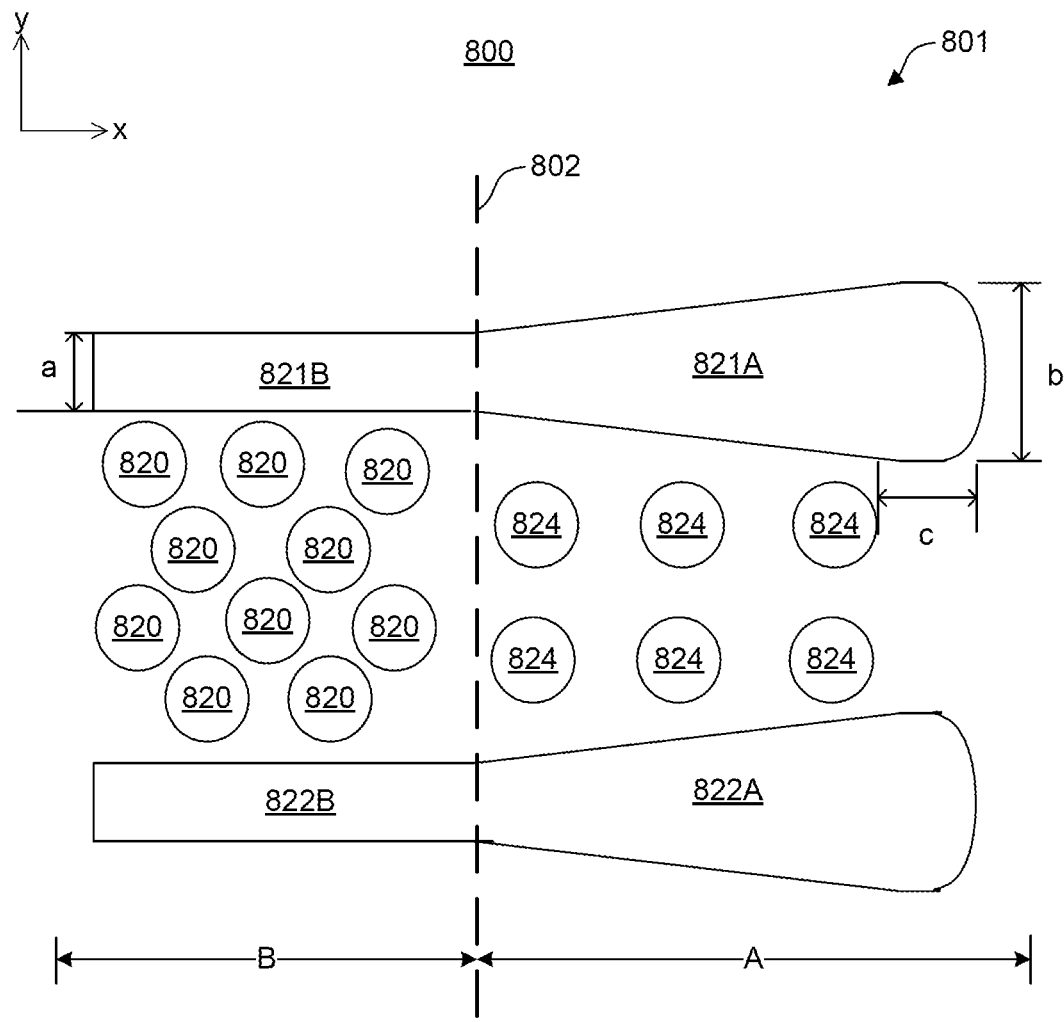

FIGS. 6-8 illustrate top views of three-dimensional NAND memory devices in which the width of gate line slit is increased in the wordline staircase regions in comparison to its width in the array region. Increasing the gate line slit width at the top surface of the wordline staircase region can lead to an increased width at the bottom of the gate line slit. A benefit, among others, of increasing the gate line slit width in the wordline staircase region is facilitating uniform metal dispose and avoiding metal agglomeration at the bottom of the gate line slit. Uniform metal dispose within the gate line slit in turn provides uniform gate electrode material etch back and prevents current leakage or shorts between adjacent gate electrodes. In various designs and applications, design and location of gate line slits can vary according to different design rules and should not be limited by the embodiments of the present disclosure.

FIG. 6 illustrates exemplary structure 600 for forming the three-dimensional memory device, according to some embodiments. FIG. 6 is a top view 601 of exemplary structure 600 which includes wordline staircase region A and array region B. Regions A and B abut each other at a region boundary 602, marked by the dotted line. An array of semiconductor channels 620 are formed in region B and an array of metal contact vias 624 are formed in region A. The semiconductor channels and metal contact vias are formed between a pair of gate line slits 621 and 622. Gate line slit 621 includes gate line slit 621A formed in region A and gate line slit 621B formed in region B. Similarly, gate line slit 622 includes gate line slit 622A and 622B formed in regions A and B respectively. Gate line slits 621A, 621B, 622A, and 622B can each have a rectangular shape as in the top view 601. Exemplary structure 600 also includes other structures and/or features and are not shown in FIG. 6 for simplicity and clarity.

To reduce gate electrode material agglomeration at the bottom of the vertical trenches, gate line slits in the wordline staircase region can have greater widths than the array region. For example, gate line slits 621B and 622B have width a and gate line slits 621A and 622A have width b which can be greater than the width a. The increased width of gate line slit in the wordline staircase region can improve the etching rate at the bottom of the trench by providing chemical reactants or reactive ions of wet/dry etching processes easier access to the bottom of the trench. Therefore, the wider opening can result in a wider opening at the bottom of the vertical trenches, which in turn facilitates uniform gate electrode material dispose without metal agglomeration at the trench bottoms. During the subsequent etch back process, the uniform gate electrode material dispose in the wordline staircase structures can lead to uniform etch back rate on the trench sidewalls and electrically insulate wordlines from different tiers.

The top view of exemplary structure 600 shown in FIG. 6 illustrates gate line slits 621A and 622A having rectangular openings. The width "b" of gate line slits 621A and 622A measured in the y direction can be different. For example, the width "b" can be greater than the width "a" by a nominal amount that is determined by various factors. For example, a minimal increase in width would likely result in minimal increase in the width increase at the trench bottom, thus providing limited benefits. On the other hand, as the gate line slit is formed adjacent to the semiconductor channels and metal contact vias, increasing the width also reduces the separation between the gate line slits and their adjacent structures, which increases the risk of etching through the separation and form undesirable electrical contact between the gate line slits and adjacent structures. In addition, increasing the gate line slit also occupies more device space and therefore has an impact on device density. The gate line slit design should consider and weigh at least the above factors to provide nominal design for specific devices. In some embodiments, width b can be greater than width by an amount that is between about 10 nm to about 50 nm. For example, width b can be greater than width a for about 20 nm. In some embodiments, gate line slits 621A and 622A can have substantially the same width. In some embodiments, gate line slits 621A and 622A can have different widths, depending on the device needs and design. In some embodiments, depending on the material composition of the dielectric material stack, width "a" may also be greater than width "b" to reduce metal agglomeration.

FIG. 7 illustrates exemplary structure 700 for forming the three-dimensional memory device, according to some embodiments. FIG. 7 is a top view 701 of exemplary structure 700 which includes wordline staircase region A and array region B. Regions A and B abut each other at a region boundary 702, marked by the dotted line. Similar to exemplary structure 600 in FIG. 6, an array of semiconductor channels 720 are formed in region B and an array of metal contact vias 724 are formed in region A. The semiconductor channels and metal contact vias are formed between a pair of gate line slits 721 and 722. Gate line slit 721 includes gate line slit 721A formed in region A and gate line slit 721B formed in region B. Similarly, gate line slit 722 includes gate line slit 722A and 722B formed in regions A and B respectively. Exemplary structure 700 also includes other structures and/or features and are not shown in FIG. 7 for simplicity and clarity The top view of exemplary structure 700 shown in FIG. 7 illustrates gate line slits 721A and 722A having rectangular openings with a curved end extending in the x direction. Gate electrode material disposed at a corner of rectangular shaped slit (i.e., joints of sidewalls that are perpendicular to each other) is more challenging to achieve uniform dispose and etch back. Metal agglomeration can be formed in tight spaces (e.g., spaces formed in a corner between two sidewalls that are placed at 90° with each other) because dispose on both sidewalls accumulate in substantially the same region and can cause metal agglomeration. A curved end can reduce the agglomeration and further improves uniform dispose and etch back which in turn provides the benefit of effectively separating adjacent wordline structures. In some embodiments, the respective curved ends 731 and 732 of gate line slits 721A and 722A can be half circles connecting both sides (top and bottom sides shown in FIG. 7) of the gate line slits using width b as the diameter. In some embodiments, the curved ends can be any structure having curvature designs or curved degrees suitable for the specific device needs and design goals. For example, the curved ends can include an arc-shaped structure and the radius of the arc can be any suitable value. In some embodiments, curved ends 731 and 732 can have substantially the same curvature design. In some embodiments, the curved ends can have different curvature designs. Similar to the embodiments described above in FIG. 6, depending on the material composition of the dielectric material stack, width "a" may also be greater than width "b" to reduce metal agglomeration, in accordance with some embodiments.

FIG. 8 illustrates exemplary structure 800 for forming the three-dimensional memory device, according to some embodiments. FIG. 8 is a top view 801 of exemplary structure 800 which includes wordline staircase region A and array region B. Regions A and B abut each other at a region boundary 802, marked by the dotted line. Similar to exemplary structures 600 and 700 in FIGS. 6 and 7 respectively, an array of semiconductor channels 820 are formed in region B and an array of metal contact vias 824 are formed in region A. The semiconductor channels and metal contact vias are formed between a pair of gate line slits 821 and 822. Gate line slit 821 includes gate line slit 821A formed in region A and gate line slit 821B formed in region B. Similarly, gate line slit 822 includes gate line slit 822A and 822B formed in regions A and B respectively. Exemplary structure 800 also includes other structures and/or features and are not shown in FIG. 8 for simplicity and clarity.

The top view of exemplary structure 800 shown in FIG. 8 illustrates gate line slits 821A and 822A having gradually increased openings with a curved end. The widths of the gate line slits increases as they extend in the x direction. As shown in FIG. 8, gate line slits 821A and 822A abut gate line slits 821B and 822B respectively at the boundary between regions A and B, and can be in close proximity to semiconductor channels 820. Therefore, gradually increasing the widths of gate line slits 821A and 822A rather than having a uniform increased width can reduce the risk of impacting the semiconductor channels 820 by reducing the likelihood of causing undesirable shorts or affecting the shapes of semiconductor channels 820. As shown above in FIGS. 4A-4D, as region A extends in the positive x direction from the boundary between regions A and B, the number of underlying wordline staircase structures decreases and the depth of insulating material 413 gradually increases. Exemplary structure 800 shown in FIG. 8 can be a portion of a three-dimensional memory device, and the three-dimensional memory device can include wordline staircase regions extending in other direction such as, for example, negative y direction, positive and/or negative x direction, and/or any suitable directions. The gradually increased gate line slit openings can be designed to adapt to the increasing depth of insulating material 413 to provide uniform dispose and etch back rate in the trench along the x direction which further prevents metal agglomeration. Similar to the curved end described above in FIG. 7, the curved end can reduce the agglomeration and further improves uniform dispose and etch back which in turn provides the benefit of effectively separating adjacent wordline structures. In some embodiments, the respective curved ends 831 and 832 of gate line slits 821A and 822A can be similar to the respective curved ends 731 and 732 described above in FIG. 7. In some embodiments, curved ends 831 and 832 can have substantially the same curvature design. The curved ends can include an arc-shaped structure and the radius of the arc can be any suitable value. In some embodiments, the curved ends can have different curvature designs. In some embodiments, a horizontal distance "c" (measured in the x-direction) between the ends of gate line slits 821A and 822A (i.e., portions of the gate line slits that are furthest away in the x direction from the region boundary) and an end portion (a portion of the metal contact via that is furthest away from the region boundary in the x direction) of the last metal contact via (the metal contact via that is furthest away from the region boundary in the x direction) is between about 0.5 µm and about 2 µm. In some embodiments, the distance can be about 1.5 µm. Similar to the embodiments described above in FIG. 6, depending on the material composition of the dielectric material stack, width "a" may also be greater than width "b" to reduce metal agglomeration, in accordance with some embodiments.

Figure 9:
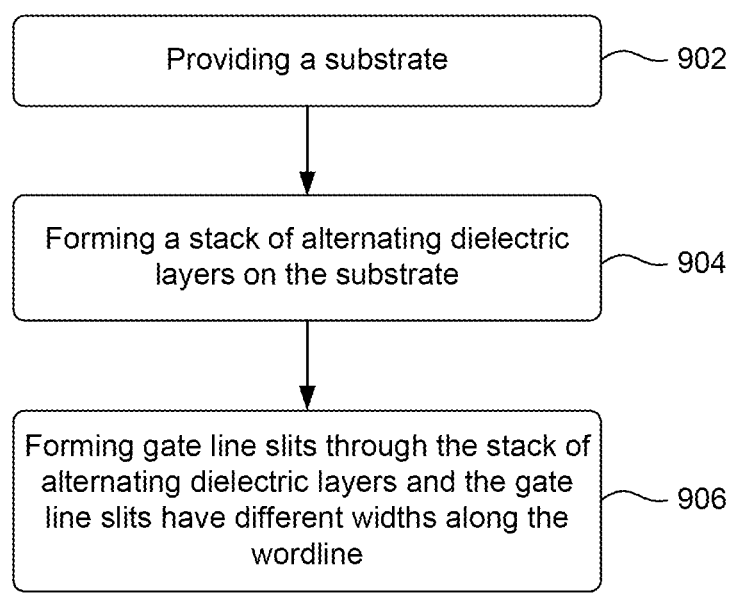
FIG. 9 illustrates an exemplary fabrication process for forming a three-dimensional memory structure, according to some embodiments.

FIG. 9 is an illustration of an exemplary method 900 for forming three-dimensional memory device, according to some embodiments. For explanation purposes, the operations shown in method 900 are described in context of FIGS. 2A-8. In various embodiments of the present disclosure, the operations of method 900 can be performed in a different order and/or vary.

In operation 902, a substrate can be provided. FIGS. 2A and 2B illustrate an exemplary substrate in this operation. The substrate can include a base substrate and a material layer over the substrate. The base substrate can include any suitable material for forming the three-dimensional memory structure. For example, the base substrate can include silicon, silicon germanium, silicon carbide, silicon on insulator (SOI), germanium on insulator (GOI), glass, gallium nitride, gallium arsenide, and/or other suitable III-V compound. In some embodiments, the material layer can include an alternating stack of insulating layers and sacrificial layers, arranged along a vertical direction over base substrate. In some embodiments, the sacrificial layers include silicon nitride and the insulating layers include silicon oxide.

In operation 904, an alternating dielectric material stack, having a staircase structure, can be formed from the substrate provided in operation 902. Referring to FIGS. 2A-2B, a number of alternatingly stacked insulating layer/sacrificial layer pairs can be formed in the stack. Referring to FIGS. 3A-3B, a staircase structure can be formed on the alternating dielectric material stack. Further, as shown in FIGS. 4A and 4B, a plurality of semiconductor channels can be formed through the stack and substantially into the base substrate. The semiconductor channels can each include at least a dielectric core, a semiconductor channel film, and a memory film. The semiconductor channels can be formed by sequentially depositing the memory film, the semiconductor channel film, and the dielectric core using suitable methods.

In operation 906, gate line slits can be formed through the stack by opening trenches and removing the sacrificial layers, followed by depositing and etching back the gate electrode material. Further, referring to FIGS. 4A-4B gate line slits through the stack can be formed from vertical trenches along the horizontal direction to divide the stack into a plurality of fingers. At least one of the gate line slits include one or more openings along the horizontal direction to connect the sacrificial layer/insulating layer pairs of adjacent fingers of the same tier. The vertical trenches can be formed by patterning a mask over the stack and etching the portions of the stack exposed by the mask. A recess etch and/or a CMP process can be used to planarize the top surface of the stack after the dielectric material is disposed. Metal contact vias can be formed on the wordlines. One or more metal contact vias can be formed on the connected wordlines to conductively connect the connected wordlines with an external circuit.

Further, referring to FIGS. 6-8, etching processes in the dielectric stack structure can form gate line slits having different widths along the x direction. In some embodiments, the widths of gate line slits in the wordline staircase region is greater than widths of gate line slits in the array region. The increased width of gate line slit in the wordline staircase region can be determined by the material compositions in the dielectric stack structure, and can be designed to improve the etching rate at the bottom of the trench by providing chemical reactants or reactive ions of wet/dry etching processes easier access to the bottom of the trench. Therefore, the wider opening can result in a wider opening at the bottom of the vertical trenches, which in turn facilitates uniform gate electrode material dispose without metal agglomeration at the trench bottoms. During the subsequent etch back process, the uniform gate electrode material dispose in the wordline staircase structures can lead to uniform etch back rate on the trench sidewalls and electrically insulate wordlines from different tiers. The width can be determined by weighing a number of factors such as, for example, the material composition in the wordline staircase region and array regions, the risk of an increased gate line slit width affecting the semiconductor channels, and the impact on device density due to the space needed for an increased gate line slit width.

Referring to FIG. 6, gate line slits in the wordline staircase region can have rectangular openings where the width measured in the y direction can be greater than the width of gate line slits in the array regions. In some embodiments, gate line slit width in the wordline staircase region can be greater than its width in the array region by an amount that is between about 10 nm to about 50 nm. For example, the width difference can about 20 nm. In some embodiments, the gate line slits in the wordline staircase regions can have substantially the same width. In some embodiments, gate line slits in the wordline staircase regions can have different widths, depending on the device needs and design.

Referring to FIG. 7, gate line slits can have rectangular openings with a curved end. A curved end can reduce the agglomeration at the bottom of the gate line slits and further improves uniform dispose and etch back which in turn provides the benefit of effectively separating adjacent wordline structures. In some embodiments, the curved ends of the gate line slits can be half circles connecting both top and bottom sides of the gate line slits (as viewed from the top) using gate line slit width as the diameter. In some embodiments, the curved ends can be any structure having curvature designs or curved degrees suitable for the specific device needs and design. In some embodiments, curved ends of gate line slits formed in the wordline staircase region can have substantially the same curvature design. In some embodiments, the curved ends can have different curvature designs.

Referring to FIG. 8, gate line slits in the wordline staircase region can have gradually increased openings with a curved end. The widths of the gate line slits increases as they extend in the x direction. The gradually increased widths of gate line slits can reduce the risk of impacting the semiconductor channels by reducing the likelihood of causing undesirable shorts or affecting the shapes of semiconductor channels. In addition, the gradually increased gate line slit openings can be designed to adapt to the increasing depth of insulating material formed in the wordline staircase region and provide uniform dispose and etch back rate in the trench along the x direction, which further prevents metal agglomeration. Further, the curved end at the end of gate line slits in the wordline staircase region can reduce the agglomeration and further improves uniform dispose and etch back which in turn provides the benefit of effectively separating adjacent wordline structures. In some embodiments, the curved ends of gate line slits in the wordline staircase structure can have substantially similar designs. In some embodiments, the curved ends can have different curvature designs. In some embodiments, a horizontal distance between the ends of gate line slits (a point on the curved end that is furthest away from the region boundary) and the last metal contact via (i.e., furthest away from the region boundary) is between about 0.5 µm and about 2 µm. In some embodiments, the distance can be about 1.5 µm.

The present disclosure describes a three-dimensional NAND memory device in which gate line slits can have a greater width in the wordline staircase region compared to the widths in the array region. Increasing the gate line slit width at the top surface of the wordline staircase region can lead to an increased width at the bottom of the gate line slit. A benefit, among others, of increasing the gate line slit width in the wordline staircase region is facilitating uniform metal deposition and avoid metal agglomeration at the bottom of the gate line slit. Uniform metal deposition within the gate line slit in turn provides uniform gate electrode material etch back and prevents current leakage or shorts between adjacent gate electrodes.

In some embodiments, a memory device includes a substrate and a plurality of wordlines extending along a first direction over the substrate. The first direction is along the x direction. The plurality of wordlines form a staircase structure in a first region. A plurality of channels are formed in a second region and through the plurality of wordlines. The second region abuts the first region at a region boundary. The memory device further includes a plurality of contact structures formed in the second region. Each one contact structure of the plurality of contact structures is electrically connected to at least one wordline of the plurality of wordlines. The memory device also includes an insulating slit formed in the first and second regions and along the first direction. A first width of the insulating slit in the first region measured in a second direction is greater than a second width of the insulating slit in the second region measured in the second direction.

In some embodiments, a memory device includes a wordline staircase region extending along a first direction. The memory device also includes an array region. The memory device further includes a plurality of channels formed between adjacent slit structures of the plurality of slit structures. The memory device also includes a plurality of slit structures where each slit structure includes first and second slit structures formed in the wordline staircase region and the array region respectively. The widths of the first and second slit structures are different.

In some embodiments, a semiconductor device includes a substrate and a slit formed in the substrate. The slit includes a wordline staircase slit abutting an array slit. The wordline staircase slit and array slit are respectively formed in wordline staircase and array regions. A width of the wordline staircase slit is greater than a width of the array slit.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
a plurality of wordlines extending along a first lateral direction, wherein the plurality of wordlines form a staircase structure in a first region;
one or more rows of contact structures formed in the first region, wherein each row of the one or more rows of contact structures is positioned along the first lateral direction and comprises two or more contact structures;
a plurality of channels formed in a second region abutting the first region; and
a slit structure formed in the first and second regions, wherein:
the slit structure extends along the first lateral direction;
the slit structure comprises a first width in the first region and measured in a second lateral direction; and
the slit structure comprises a second width in the second region measured in the second lateral direction and is less than the first width, wherein a row of contact structures of the one or more rows of contact structures comprises first and second contact structures, and wherein the first contact structure and the slit structure are separated by a first lateral distance and the second contact structure and the slit structure are separated by a second lateral distance that is different from the first lateral distance.

2. The memory device of claim 1, wherein the slit structure comprises an insulating material.

3. The memory device of claim 1, wherein the slit structure in the first region comprises a rectangular shape.

4. The memory device of claim 1, wherein the slit structure in the second region comprises a rectangular shape.

5. The memory device of claim 1, wherein the second lateral direction is perpendicular to the first lateral direction.

6. The memory device of claim 1, wherein each contact structure of the one or more rows of contact structures is electrically coupled to a wordline of the plurality of wordlines.

7. The memory device of claim 1, wherein the first lateral distance is less than the second lateral distance.

8. The memory device of claim 1, wherein the first contact structure is positioned further away from the second region than the second contact structure.

9. The memory device of claim 1, wherein the first and second lateral directions are parallel to a top surface of a substrate.

10. The memory device of claim 1, wherein the second width is substantially uniform along the first lateral direction.

11. A memory device, comprising:
a wordline staircase region;
one or more rows of contact structures formed in the wordline staircase region, wherein a row of contact structures of the one or more rows of contact structures are positioned along a first lateral direction and comprises first and second contact structures;
an array region abutting the wordline staircase region; and
a slit structure formed in the wordline staircase region and the array region, comprising:
a first portion formed in the wordline staircase region, wherein the first portion is separated from the first contact structure by a first lateral distance and separated from the second contact structure by a second lateral distance different from the first lateral distance, and wherein the first and second lateral distances are oriented along a second lateral direction perpendicular to the first lateral direction; and
a second portion formed in the array region.

12. The memory device of claim 11, further comprising one or more rows of channels in the array region, wherein a given one of the one or more rows of channels extends along the first lateral direction and comprises first and second channels.

13. The memory device of claim 12, wherein the second portion is separated from the first channel by a third lateral distance and separated from the second channel by a fourth lateral distance, wherein the third and fourth lateral distances are oriented in the second lateral direction and are substantially the same.

14. The memory device of claim 11, wherein the slit structure continuously passes through the wordline staircase region and the array region.

15. The memory device of claim 11, wherein a slit structure of the plurality of slit structures comprises a rectangular shape.

16. A memory device, comprising:
a wordline staircase region;
an array region abutting the wordline staircase region;
first and second slit structures extending along a first lateral direction, wherein each of the first and second slit structures continuously passes from a portion of the wordline staircase region to a portion of the array region, and wherein:
a first portion of the first slit structure and a first portion of the second slit structure are formed in the wordline staircase region; and
a second portion of the first slit structure and a second portion of the second slit structure are formed in the array region; and
a row of contact structures positioned along the first lateral direction and between the first portions of the first and second slit structures, wherein a first lateral distance between a first contact structure of the row of contact structures and the first portion of the first slit structure is greater than a second lateral distance between a second contact structure of the row of contact structures and the first portion of the first slit structure, and wherein the first and second lateral distances are oriented in a second lateral direction perpendicular to the first lateral direction.

17. The memory device of claim 16, wherein a third lateral distance between the first contact structure and the first portion of the second slit structure is greater than the first lateral distance.

18. The memory device of claim 16, further comprising a row of channels formed in the array region and between the second portions of the first and second slit structures.

19. The memory device of claim 18, wherein a third lateral distance between a first channel of the row of channels and the second portion of the first slit structure is substantially the same as a fourth lateral distance between a second channel of the row of channels and the second portion of the first slit structure, and wherein the third and fourth lateral distances are oriented in the second lateral direction.

20. The memory device of claim 16, wherein the first and second contact structures are positioned at different lateral distances away from the array region.

* * * * *